US012672550B2

(12) United States Patent
Chang et al.

(10) Patent No.: US 12,672,550 B2
(45) Date of Patent: Jun. 30, 2026

(54) PACKAGE STRUCTURE AND MANUFACTURING METHOD THEREOF

(71) Applicant: AUO Corporation, Hsin-Chu (TW)

(72) Inventors: Chun Chang, Hsin-Chu (TW); Hsia-Tsai Hsiao, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 944 days.

(21) Appl. No.: 17/862,438

(22) Filed: Jul. 12, 2022

(65) Prior Publication Data

US 2023/0207495 A1 Jun. 29, 2023

(30) Foreign Application Priority Data

Dec. 28, 2021 (TW) .................................. 110149194

(51) Int. Cl.
*H10W 44/00* (2026.01)
*H10W 70/05* (2026.01)
*H10W 70/65* (2026.01)
*H10W 70/685* (2026.01)
*H10W 90/00* (2026.01)

(52) U.S. Cl.
CPC ......... *H10W 44/401* (2026.01); *H10W 70/05* (2026.01); *H10W 70/65* (2026.01); *H10W 70/685* (2026.01); *H10W 90/724* (2026.01)

(58) Field of Classification Search
CPC ....... H01L 21/4857; H01L 2224/16227; H01L 23/49811; H01L 23/49822; H01L 23/49838; H01L 23/64; H01L 23/647;

H01L 24/13; H01L 24/16; H01L 2924/19041; H01L 2924/19042; H01L 2924/19043; H01L 2924/19101; H01L 23/645
USPC ......................................................... 361/767
See application file for complete search history.

(56) References Cited

U.S. PATENT DOCUMENTS

| | | | |
|---|---|---|---|
| 2003/0030994 A1* | 2/2003 | Takaya ................ | H01F 17/0006 361/728 |
| 2014/0177189 A1 | 6/2014 | Liu et al. | |
| 2019/0131287 A1 | 5/2019 | Huang et al. | |
| 2021/0074694 A1 | 3/2021 | Huang et al. | |
| 2023/0066370 A1* | 3/2023 | Hsu ........................ | H01L 21/563 |

FOREIGN PATENT DOCUMENTS

| | | |
|---|---|---|
| CN | 110600438 A | 12/2019 |
| CN | 212392241 U | 1/2021 |
| TW | 201426961 A | 7/2014 |

\* cited by examiner

*Primary Examiner* — Timothy J Thompson
*Assistant Examiner* — Sidi M Maiga
(74) *Attorney, Agent, or Firm* — WPAT, PC

(57) ABSTRACT

A package structure includes a redistribution structure, a first conductive portion, a second conductive portion and a third conductive portion. The redistribution structure includes a first conductive pad and a second conductive pad. The first conductive portion is electrically connected with the first conductive pad. The second conductive portion is electrically connected with the second conductive pad. The first conductive portion at least partially overlaps the second conductive portion. The third conductive portion and the second conductive portion are located at the same layer. The third conductive portion does not overlap any conductive portion which is located at the same layer as the first conductive portion.

18 Claims, 19 Drawing Sheets

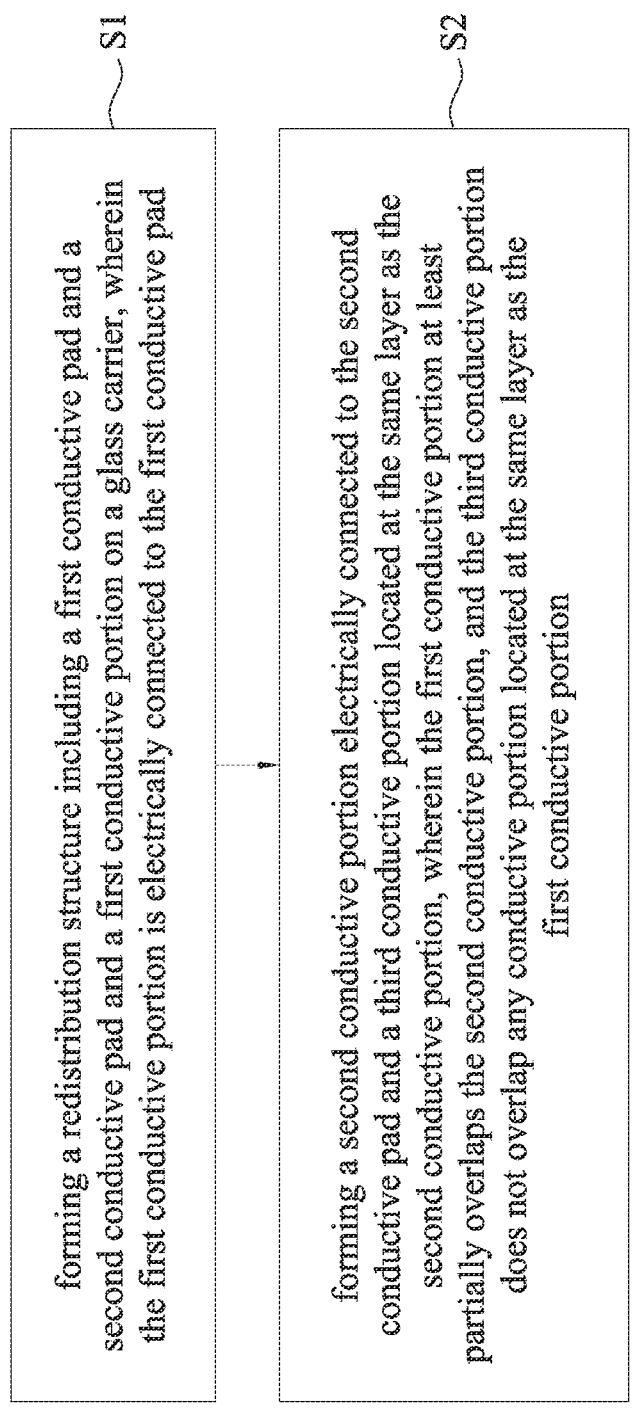

S1 forming a redistribution structure including a first conductive pad and a second conductive pad and a first conductive portion on a glass carrier, wherein the first conductive portion is electrically connected to the first conductive pad

S2 forming a second conductive portion electrically connected to the second conductive pad and a third conductive portion located at the same layer as the second conductive portion, wherein the first conductive portion at least partially overlaps the second conductive portion, and the third conductive portion does not overlap any conductive portion located at the same layer as the first conductive portion

Fig. 6

PACKAGE STRUCTURE AND MANUFACTURING METHOD THEREOF

RELATED APPLICATION

This application claims priority to Taiwan Application Serial Number 110149194, filed Dec. 28, 2021, which is herein incorporated by reference in its entirety.

BACKGROUND

Field of Invention

The present disclosure relates to a package structure and a manufacturing method of the package structure.

Description of Related Art

In general, in thin film wafer-level packaging processes, an integrated passive device (IPD) is usually disposed in a chip package or disposed on an outer surface of a redistribution structure. However, because a manufacturing space in the chip package is small, the number of the integrated passive devices in the chip package is limited, which reduces the performance of the chip package. In addition, disposing the integrated passive devices on the outer surface of the redistribution structure not only increases manufacturing cost of the chip package, but also increases a thickness of the chip package, which is not advantageous to miniaturize.

SUMMARY

An aspect of the present disclosure is related to a package structure.

According to one embodiment of the present disclosure, a package structure includes a redistribution structure, a first conductive portion, a second conductive portion and a third conductive portion. The redistribution structure includes a first conductive pad and a second conductive pad. The first conductive portion is electrically connected to the first conductive pad. The second conductive portion is electrically connected to the second conductive pad. The first conductive portion at least partially overlaps the second conductive portion. The third conductive portion is located at the same layer as the second conductive portion. The third conductive portion does not overlap any conductive portion located at the same layer as the first conductive portion.

In one embodiment of the present disclosure, the package structure further includes a dielectric layer. The dielectric layer is located between the first conductive portion and the second conductive portion. The first conductive portion, the dielectric layer and the second conductive portion form a capacitor.

In one embodiment of the present disclosure, an area of a surface of the second conductive portion facing the dielectric layer is different from an area of a surface of the third conductive portion facing the dielectric layer.

In one embodiment of the present disclosure, the package structure further includes a dielectric layer and a conductive pillar. The dielectric layer is located between the first conductive portion and the second conductive portion. The conductive pillar is located in the dielectric layer and electrically connected to the first conductive portion and the second conductive portion.

In one embodiment of the present disclosure, the package structure further includes a first resistance line. The first resistance line is electrically connected between the second conductive portion and the second conductive pad.

In one embodiment of the present disclosure, the package structure further includes a second resistance line. The second resistance line is electrically connected to the third conductive portion. The second resistance line is located at the same layer as the third conductive portion, and the second resistance line does not overlap any conductive portion located at the same layer as the first conductive portion.

In one embodiment of the present disclosure, a length of the first resistance line is different from a length of the second resistance line.

In one embodiment of the present disclosure, the package structure further includes a first inductive coil. The first inductive coil is electrically connected between the second conductive portion and the second conductive pad.

In one embodiment of the present disclosure, the package structure further includes a second inductive coil. The second inductive coil is electrically connected to the third conductive portion. The second inductive coil is located at the same layer as the third conductive portion, and the second inductive coil does not overlap any conductive portion located at the same layer as the first conductive portion.

In one embodiment of the present disclosure, the number of turns of the first inductive coil is different from the number of turns of the second inductive coil.

An aspect of the present disclosure is related to a manufacturing method of a package structure.

According to one embodiment of the present disclosure, a manufacturing method of a package structure includes: forming a redistribution structure comprising a first conductive pad and a second conductive pad and a first conductive portion on a glass carrier, wherein the first conductive portion is electrically connected to the first conductive pad; and forming a second conductive portion electrically connected to the second conductive pad and a third conductive portion located at the same layer as the second conductive portion, wherein the first conductive portion at least partially overlaps the second conductive portion, and the third conductive portion does not overlap any conductive portion located at the same layer as the first conductive portion.

In one embodiment of the present disclosure, forming the redistribution structure and the first conductive portion on the glass carrier is performed such that the first conductive portion, the first conductive pad and the second conductive pad are located at the same layer.

In one embodiment of the present disclosure, forming the redistribution structure on the glass carrier is performed such that the first conductive pad is separated from the second conductive pad.

In one embodiment of the present disclosure, the method further includes forming a dielectric layer on the redistribution structure and the first conductive portion prior to forming the second conductive portion and the third conductive portion such that the first conductive portion, the dielectric layer and the second conductive portion form a capacitor.

In one embodiment of the present disclosure, the method further includes: forming a dielectric layer on the redistribution structure and the first conductive portion prior to forming the second conductive portion and the third conductive portion; and forming a conductive pillar in the dielectric layer such that the conductive pillar is electrically connected to the first conductive portion and the second conductive portion.

In the embodiments of the present disclosure, the first conductive portion of the package structure may be regarded as a bottom of an integrated passive device (such as a capacitor, an inductive or a resistor), and the bottom of the integrated passive device may be located at the same layer as one of layers of the redistribution structure. In this way, the bottom of the integrated passive device and the redistribution structure can be manufactured together to reduce the manufacturing cost of the integrated passive device. In addition, the manufacturing space of the package structure is larger than that of the chip package, so the difficulty of manufacturing the integrated passive integrated passive device may be reduced, and the number of integrated passive integrated passive devices may be increased to improve the performance of the overall device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1B and FIG. 10 illustrate top views at various stages of a manufacturing method of the package structure of FIG. 1A.

FIG. 6 illustrates a flow chart of a manufacturing method of a package structure according to one embodiment of the present disclosure.

DETAILED DESCRIPTION

Figure 1A:
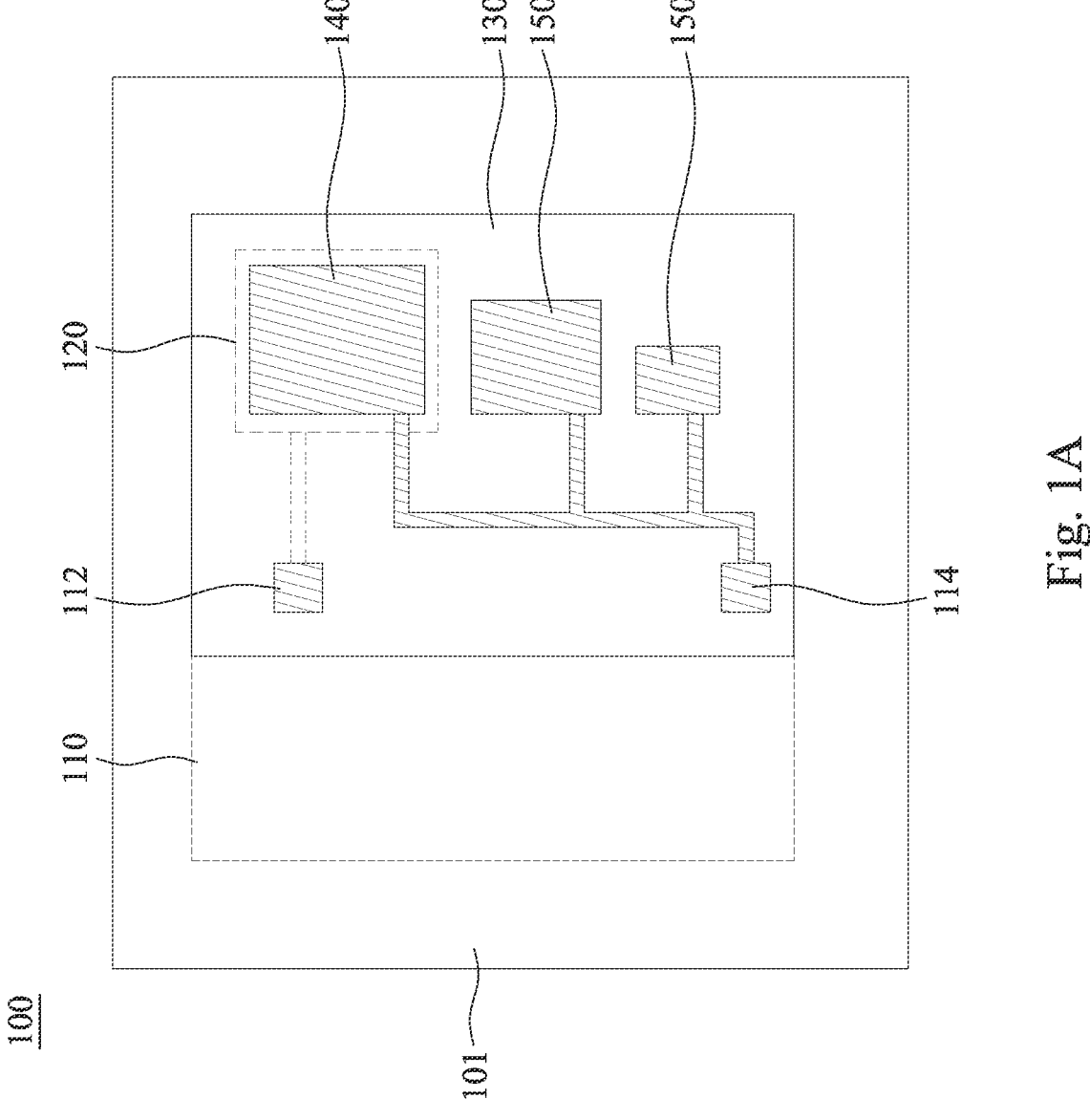
FIG. 1A illustrates a top view of a package structure according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper," "front," "back" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A illustrates a top view of a package structure 100 according to one embodiment of the present disclosure. The package structure 100 includes a redistribution structure 110, a first conductive portion 120, a second conductive portion 140 and third conductive portions 150 and 150a. The redistribution structure 110 includes a first conductive pad 112 and a second conductive pad 114. In some embodiments, the redistribution structure 110 may be located on a glass carrier 101. The first conductive pad 112 of the redistribution structure 110 is electrically connected to the first conductive portion 120 below the second conductive portion 140. The second conductive pad 114 of the redistribution structure 110 is electrically connected to the second conductive portion 140. The first conductive portion 120 at least partially overlaps the second conductive portion 140. The third conductive portions 150 and 150a and the second conductive portion 140 are located at the same layer, and the third conductive portions 150 and 150a do not overlap any conductive portion located at the same layer as the first conductive portion 120. The first conductive portion 120 may be customized, and different numbers and sizes of the first conductive portion 120 may be provided according to requirements. On the other hand, the second conductive portion 140 and the third conductive portions 150 and 150a may be the common level and manufactured according to a mask module.

In some embodiments, the package structure 100 further includes a dielectric layer 130. The dielectric layer 130 is located between the first conductive portion 120 and the second conductive portion 140 so that the first conductive portion 120, the dielectric layer 130 and the second conductive portion 140 form a capacitor. It is noted that a bottom of the capacitor (such us the first conductive portion 120) is located at the same layer as one of the layers of the redistribution structure 110, which may reduce the manufacturing cost of the capacitor. In addition, a manufacturing space of the package structure 100 is larger than that of a chip package, which may reduce the difficulty of manufacturing the capacitor and increase the number of capacitors. In some embodiments, an area of a surface of the second conductive portion 140 facing the dielectric layer 130 is different from areas of surfaces of the third conductive portions 150 and 150a facing the dielectric layer 130. In detail, the area of the surface of the second conductive portion 140 facing the dielectric layer 130 is larger than the area of the surface of the third conductive portion 150 facing the dielectric layer 130, and the area of the surface of the third conductive portion 150 facing the dielectric layer 130 is larger than the area of the surface of the third conductive portion 150*a* facing the dielectric layer 130.

Specifically, the first conductive portion 120 of the package structure 100 may be regarded as the bottom of the integrated passive device (such as a capacitor, an inductive or a resistor). That is, the bottom of the integrated passive device may be located at the same layer as one of the layers of the redistribution structure 110. In this way, the bottom of the integrated passive device and the redistribution structure 110 may be manufacturing together to reduce the manufacturing cost of the integrated passive device. In addition, the difficulty of manufacturing the integrated passive device may be reduced, and the number of integrated passive devices may be increased to improve the performance of the overall device.

It is to be noted that the connection relationship of the aforementioned elements will not be repeated. In the following description, a manufacturing method of the package structure 100 will be described.

Figure 1B:
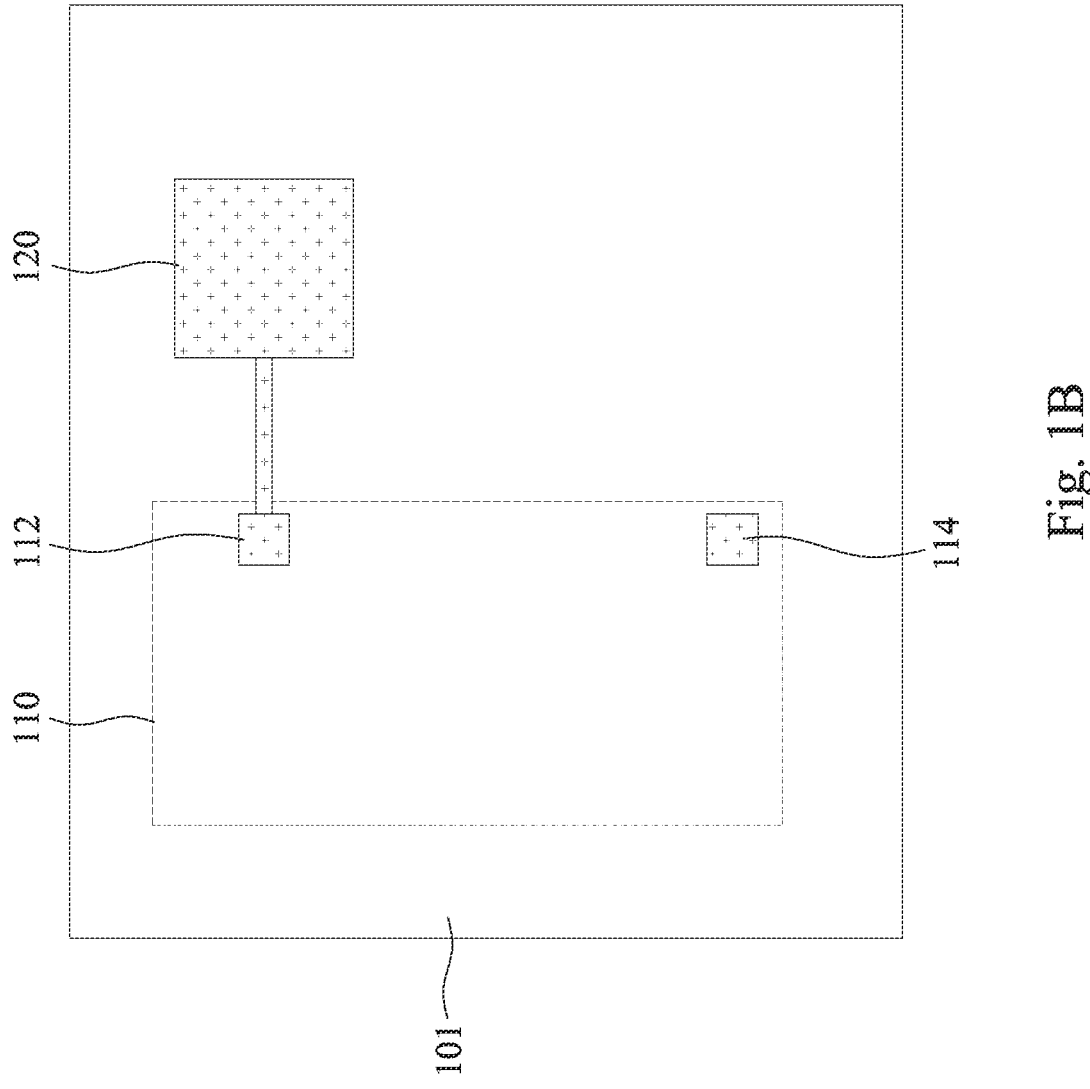
Figure 1C:
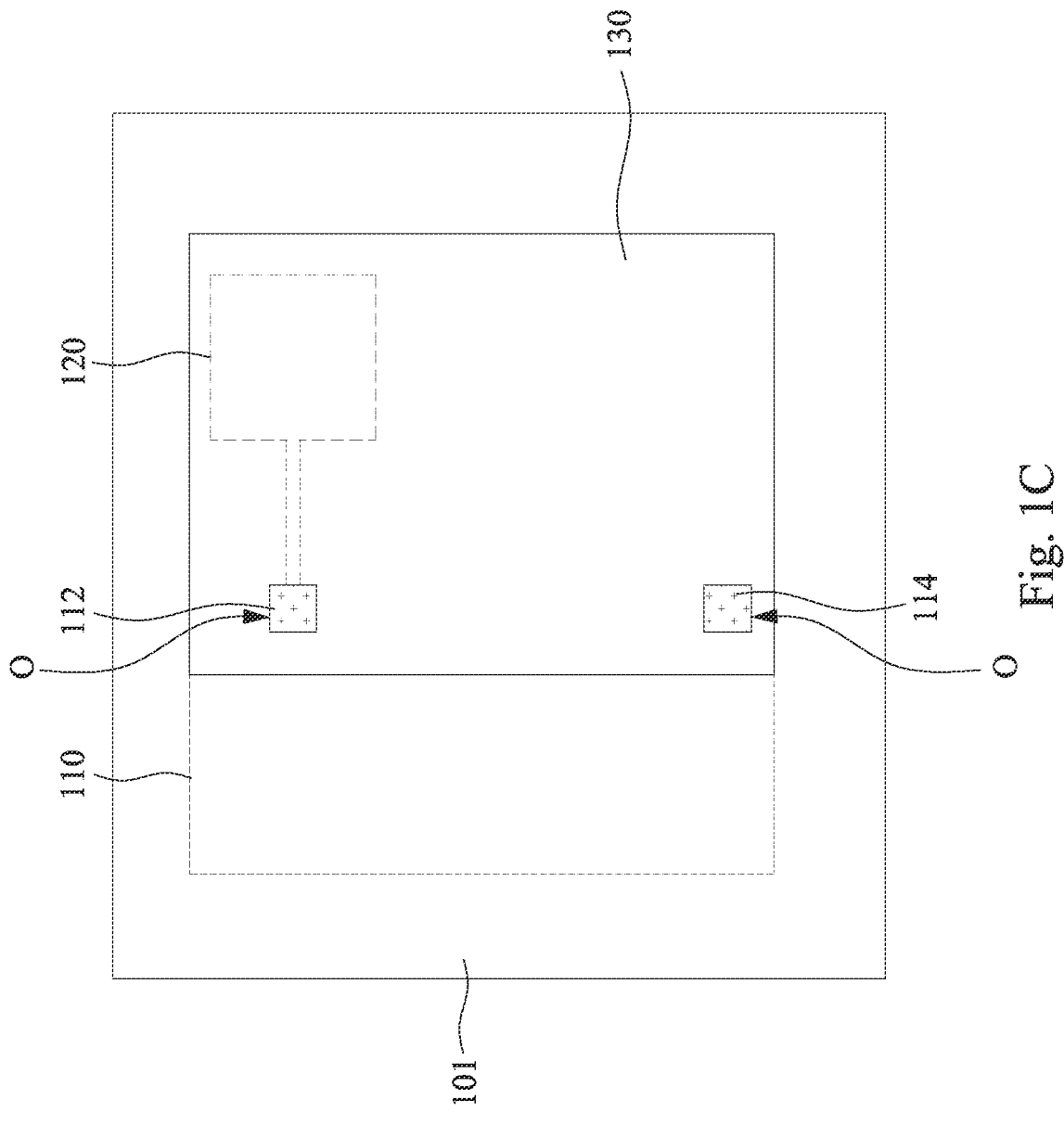

FIG. 1B and FIG. 10 illustrate top views at various stages of a manufacturing method of the package structure of FIG. 1A. Referring to both FIG. 1B and FIG. 10, first, the redistribution structure 110 and the first conductive portion 120 are formed on the glass carrier 101. The first conductive portion 120 may be customized, and different numbers and sizes of the first conductive portion 120 may be provided according to requirements. The redistribution structure 110 includes the first conductive pad 112 and the second conductive pad 114. The first conductive portion 120 is electrically connected to the first conductive pad 112 of the redistribution structure 110. The first conductive portion 120 is located at the same layer as the first conductive pad 112 and the second conductive pad 114 of the redistribution structure 110. Next, the dielectric layer 130 may be formed on the redistribution structure 110 and the first conductive portion 120. For example, the dielectric layer 130 may be formed by a chemical vapor deposition (CVD) process and an exposure and development process, and the thickness of the dielectric layer 130 may be adjusted according to requirements. After the dielectric layer 130 is formed, the dielectric layer 130 may be patterned so that the dielectric layer 130 has two openings O.

Referring back to FIG. 1A, after patterning the dielectric layer 130, the second conductive portion 140 and the third conductive portions 150 and 150*a* may be formed on the dielectric layer 130. For example, the second conductive portion 140 and the third conductive portions 150 and 150*a* may be formed by a physical vapor deposition (PVD) process and a exposure and development process. The second conductive portion 140 and the third conductive portions 150 and 150*a* may be the common level and manufactured according to a mask module. The second conductive portion 140 and the third conductive portions 150 and 150*a* are electrically connected to the second conductive pad 114 of the redistribution structure 110. The first conductive portion 120 at least partially overlaps the second conductive portion 140. The third conductive portions 150 and 150*a* and the second conductive portion 140 are located at the same layer, and the third conductive portions 150 and 150*a* do not overlap any conductive portion on the same layer as the first conductive portion 120. For example, the first conductive portion 120 is located under the second conductive portion 140 and the third conductive portions 150 and 150*a*. In some embodiments, the dielectric layer 130 is located between the first conductive portion 120 and the second conductive portion 140 so that the first conductive portion 120, the dielectric layer 130 and the second conductive portion 140 form a capacitor. The bottom of the capacitor (such as the first conductive portion 120) may be manufactured together with the redistribution structure 110 to reduce the manufacturing cost of the capacitor. Furthermore, the number of capacitors may be increased.

In the following description, other types of manufacturing methods of package structures will be described.

FIG. 2A to FIG. 2F illustrate cross-sectional views at various stages of a manufacturing method of a package structure according to one embodiment of the present disclosure. Referring to both FIG. 2A and FIG. 2B, first, a first material layer PI1 may be formed on the glass carrier 101. Next, the first material layer PI1 may be patterned to form the structure shown in FIG. 2A. After patterning the first material layer PI1, a seed layer and a patterned photoresist (not shown) may be sequentially formed. Next, a circuit 103 may be formed through an electroplating process. After the circuit 103 is formed, the photoresist and the seed layer below the photoresist may be stripped to form the structure shown in FIG. 2B.

Figures 2A, 2B:
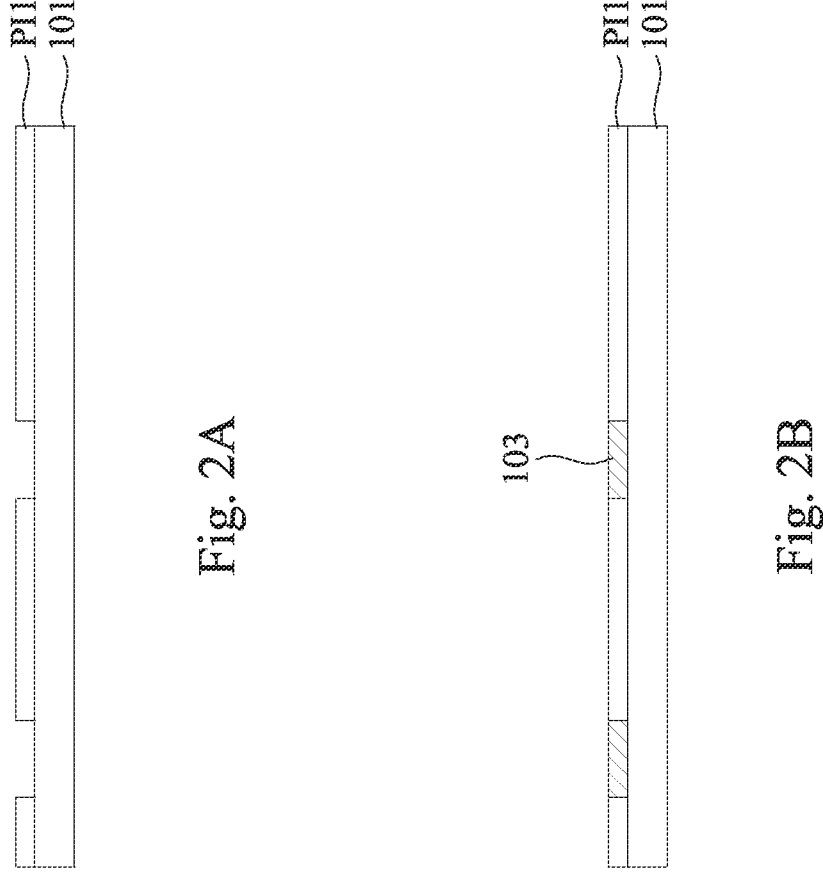
FIG. 2A to FIG. 2F illustrate cross-sectional views at various stages of a manufacturing method of a package structure according to one embodiment of the present disclosure.
Figures 2C, 2D:
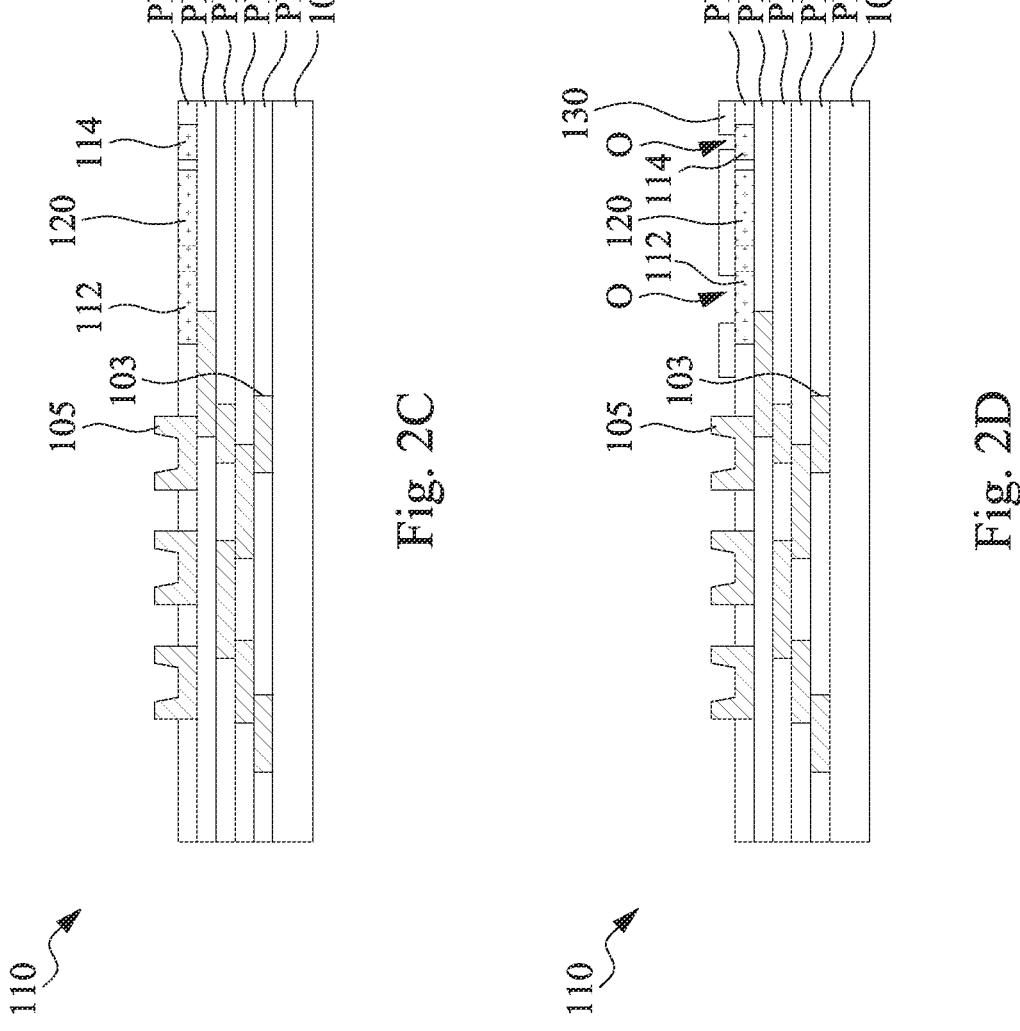

Referring to FIG. 2C, a second material layer PI2, a third material layer PI3, a fourth material layer PI4, a fifth material layer PI5 and the circuit 103 between the two adjacent material layers may be formed in a way of forming the first material layer PI1 and the circuit 103, and a top circuit 105, the first conductive pad 112, the second conductive pad 114 and the first conductive portion 120 are formed in the fifth material layer PI5. The top circuit 105 may be used as an under bump metallurgy (UBM). The first conductive portion 120 may be customized, and different numbers and sizes of the first conductive portion 120 may be provided according to requirements. The first conductive pad 112 and the second conductive pad 114 of the redistribution structure 110 are located at the same layer as the first conductive portion 120. In some embodiments, the circuit 103, the top circuit 105, the first conductive pad 112, the second conductive pad 114 and the first conductive portion 120 may be made of a material that includes copper and formed by electroplating. The first material layer PI1, the second material layer PI2, the third material layer PI3, fourth material layer PI4 and the fifth material layer PI5 may be made of a material that includes polyimide (PI), but it is not limited in this regard.

Figures 2E, 2F:
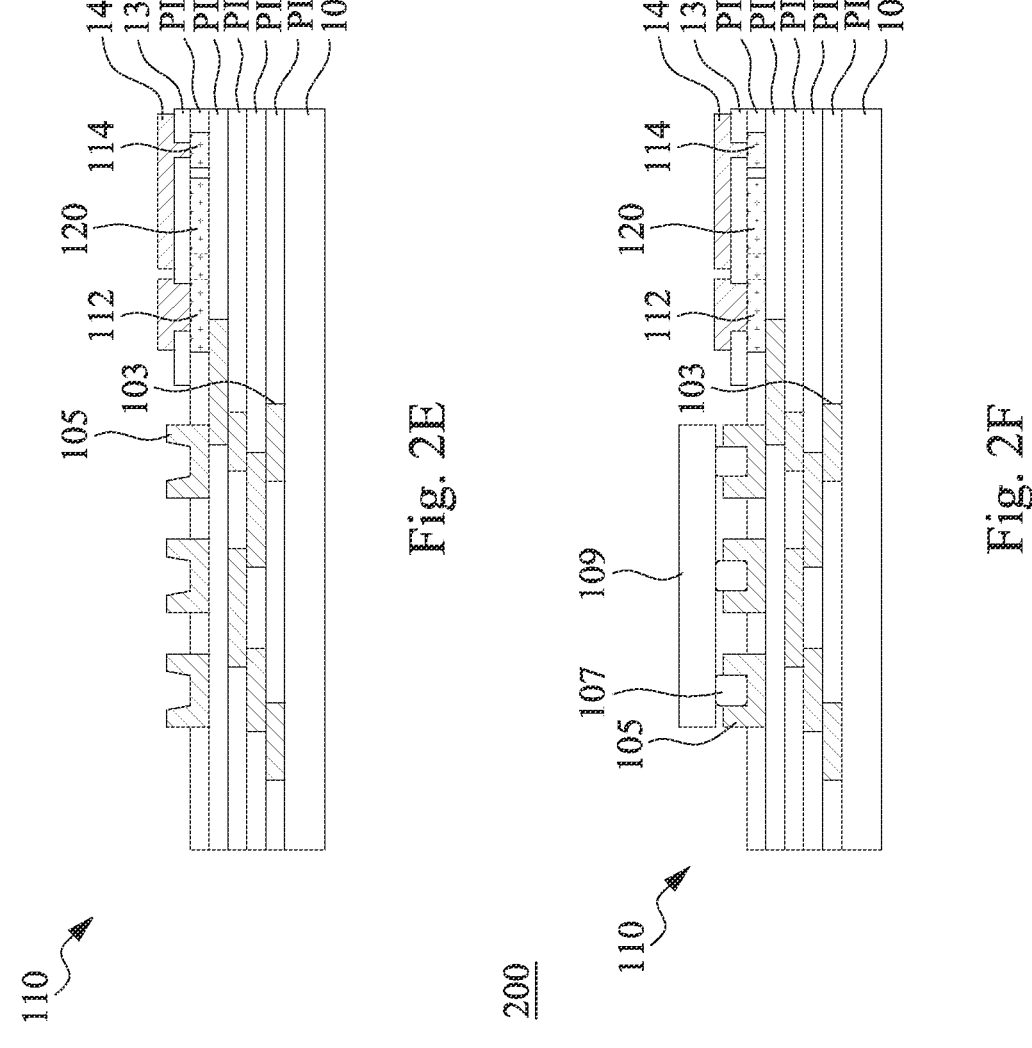

Referring to FIG. 2D to FIG. 2F. After the top circuit 105, the first conductive pad 112, the second conductive pad 114 and the first conductive portion 120 are formed, the dielectric layer 130 may be formed on the first conductive pad 112, the second conductive pad 114 and the first conductive portion 120. The dielectric layer 130 may be patterned so that the dielectric layer 130 has the two openings O. In some embodiments, the dielectric layer 130 may be made of a material that includes silicon nitride (SiN) and titanium oxide (TitO), but it is not limited in this regard. After the dielectric layer 130 is formed, the second conductive portion 140 may be formed on the dielectric layer 130 and in the openings O. The second conductive portion 140 and the third conductive portions 150 and 150*a* may be the common level and manufactured according to a mask module. The first conductive portion 120 at least partially overlaps the second conductive portion 140. The dielectric layer 130 is located between the first conductive portion 120 and the second conductive portion 140 so that the first conductive portion 120, the dielectric layer 130 and the second conductive portion 140 form a capacitor. The bottom of the capacitor (such as the first conductive portion 120) may be manufactured together with the redistribution structure 110 to reduce the manufacturing cost of the capacitor. In addition, the number of capacitors may be increased to improve the performance of the overall device.

After the second conductive portion 140 is formed, a chip 109 may be disposed on the top circuit 105 through metal bumps 107 to electrically connect the redistribution structure 110. For example, the metal bumps 107 may be solder balls, but it is not limited in this regard.

Figures 2G, 2H:
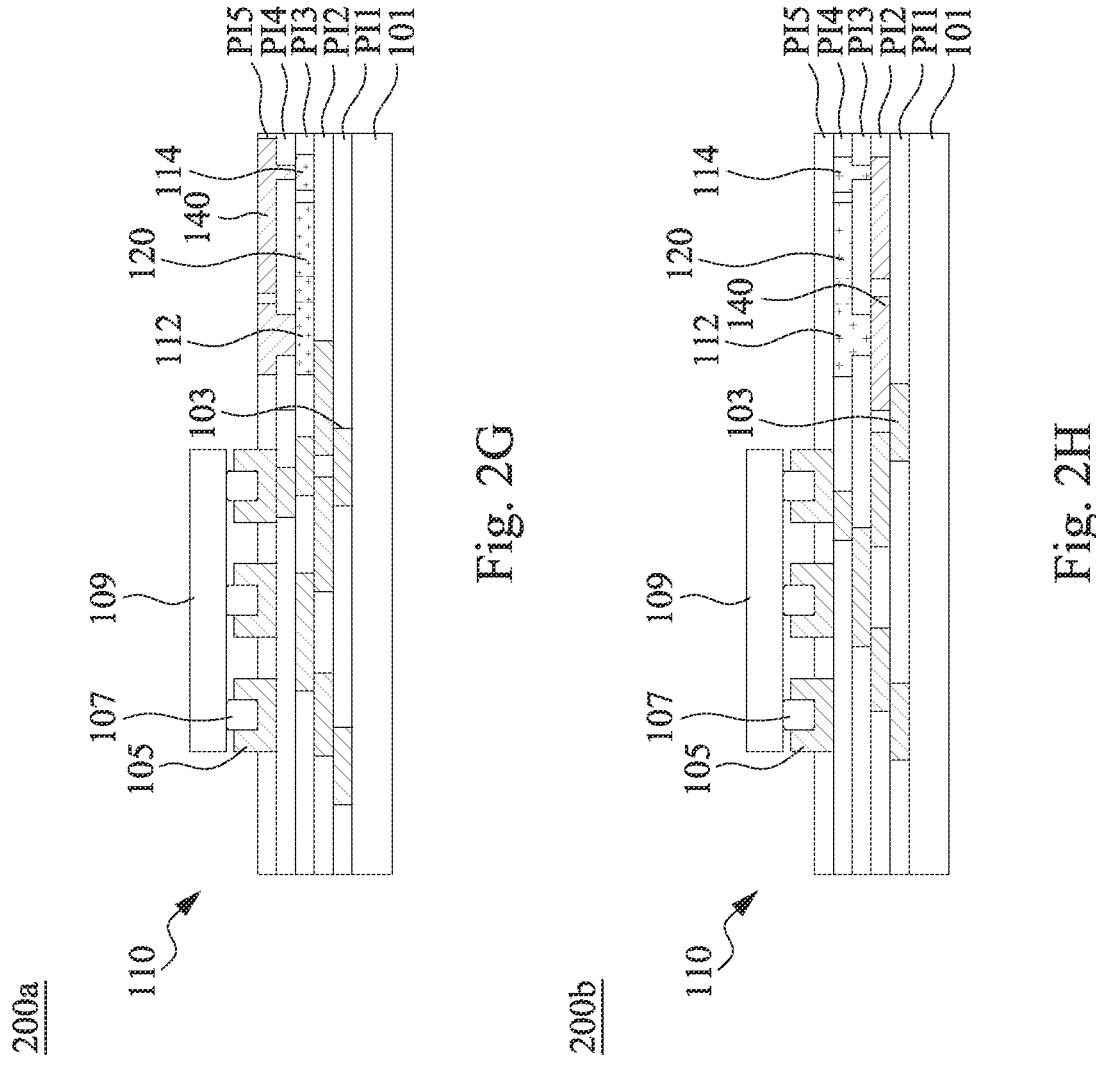
FIG. 2G illustrates a cross-sectional view of a package structure according to another embodiment of the present disclosure.
FIG. 2H illustrates a cross-sectional view of a package structure according to another embodiment of the present disclosure.

FIG. 2G illustrates a cross-sectional view of a package structure 200a according to another embodiment of the present disclosure. Referring to FIG. 2G, the difference between this embodiment and the embodiment in FIG. 2F is the first conductive pad 112, the second conductive pad 114 and the first conductive portion 120 of the package structure 200a are located in the third material layer PI3, and the second conductive portion 140 is located in the fifth material layer PI5. The fourth material layer PI4 is located between the first conductive portion 120 and the second conductive portion 140 so that the first conductive portion 120, the fourth material layer PI4 and the second conductive portion 140 form a capacitor. Integrated passive devices (such as capacitors) may be manufactured together with the redistribution structure 110 to reduce the manufacturing cost of the capacitors. In addition, the number of integrated passive devices may be increased to improve the performance of the overall device.

FIG. 2H illustrates a cross-sectional view of a package structure 200b according to another embodiment of the present disclosure. Referring to FIG. 2H, the difference between this embodiment and the embodiment in FIG. 2G is the second conductive portion 140 of the package structure 200b is located in the second material layer PI2, and the first conductive pad 112, the second conductive pad 114 and the first conductive portion 120 are located in the fourth material layer PI4. That is, the second conductive portion 140 of the package structure 200b is located below the first conductive pad 112, the second conductive pad 114 and the first conductive portion 120. The first conductive portion 120 may be customized, and different numbers and sizes of the first conductive portion 120 may be provided according to requirements. The second conductive portion 140 and the third conductive portions 150 and 150a may be at the common level and may be manufactured according to a mask module. The third material layer PI3 is located between the second conductive portion 140 and the first conductive portion 120 so that the second conductive portion 140, the third material layer PI3 and the first conductive portion 120 form a capacitor. The capacitor and the redistribution structure 110 may be manufactured together to reduce the manufacturing cost of the capacitor. In addition, the number of capacitors may be increased to improve the performance of the overall device.

Figures 3A, 3B, 3C:
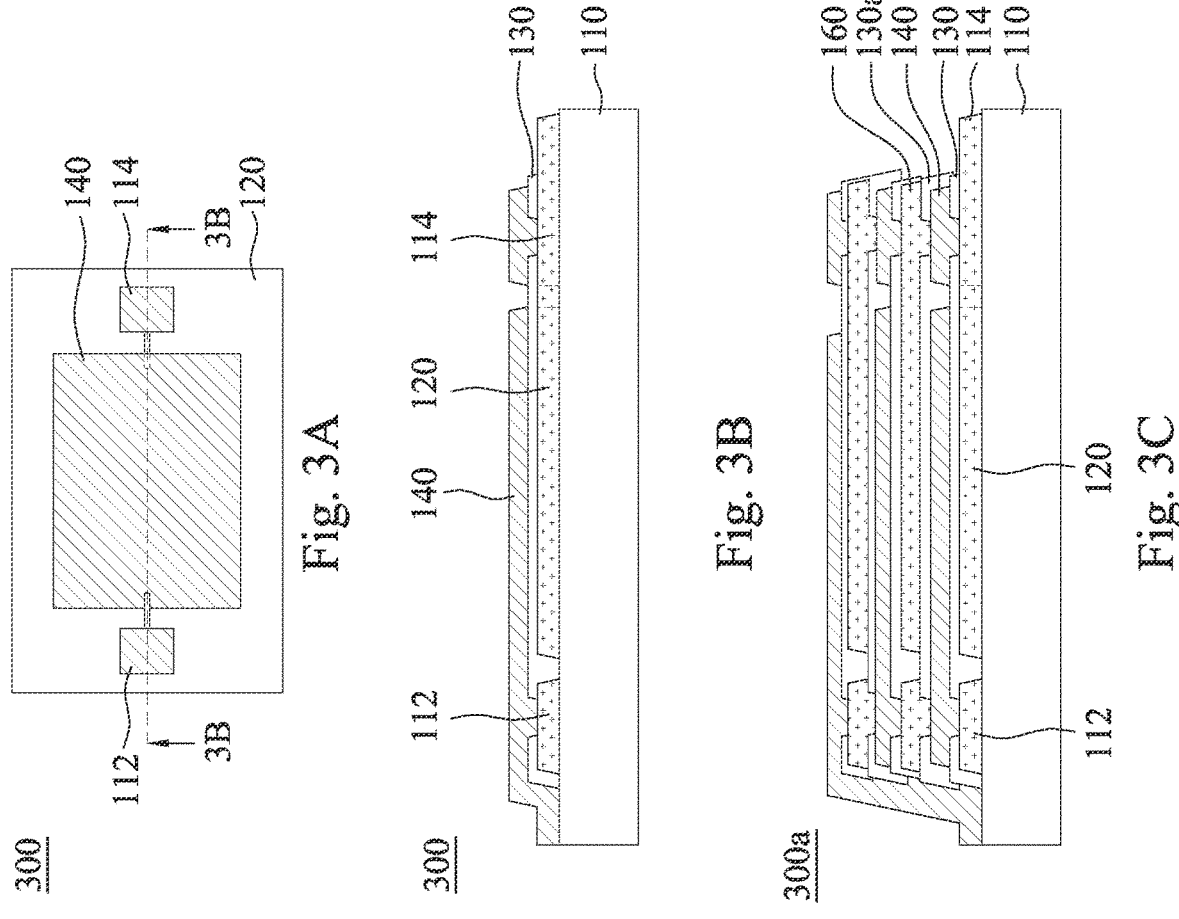
FIG. 3A illustrates a top view of a package structure according to another embodiment of the present disclosure.
FIG. 3B illustrates a cross-sectional view of the package structure of FIG. 3A along a line segment 3B-3B.
FIG. 3C illustrates a cross-sectional view of a package structure according to another embodiment of the present disclosure.

FIG. 3A illustrates a top view of a package structure 300 according to another embodiment of the present disclosure. FIG. 3B illustrates a cross-sectional view of the package structure 300 of FIG. 3A along a line segment 3B-3B. Referring to both FIG. 3A and FIG. 3B, the first conductive pad 112, the second conductive pad 114 and the first conductive portion 120 of the package structure 300 are located at the same layer. The first conductive portion 120 may be customized, and different numbers and sizes of the first conductive portion 120 may be provided according to requirements. The dielectric layer 130 is located between the first conductive portion 120 and the second conductive portion 140 so that the first conductive portion 120, the dielectric layer 130 and the second conductive portion 140 form a capacitor. The bottom of the capacitor (such as the first conductive portion 120) and the redistribution structure 110 may be manufactured together to reduce the manufacturing cost of the capacitor. In addition, the number of capacitors may be increased to improve the performance of the overall device.

FIG. 3C illustrates a cross-sectional view of a package structure 300a according to another embodiment of the present disclosure. Referring to FIG. 3C, the difference between this embodiment and the embodiment in FIG. 3B is the package structure 300 a has a dielectric layer 130a and a fourth conductive portion 160. The dielectric layer 130a of the package structure 300a is located on the second conductive portion 140, and the fourth conductive portion 160 is located on the dielectric layer 130a. That is, the first conductive portion 120, the dielectric layer 130 and the second conductive portion 140 form a first capacitor, and the second conductive portion 140, the dielectric layer 130a and the fourth conductive portion 160 form another capacitor. In this way, the total capacitance of the two parallel capacitors may be increased, and the number of masks remains unchanged.

Figure 4A:
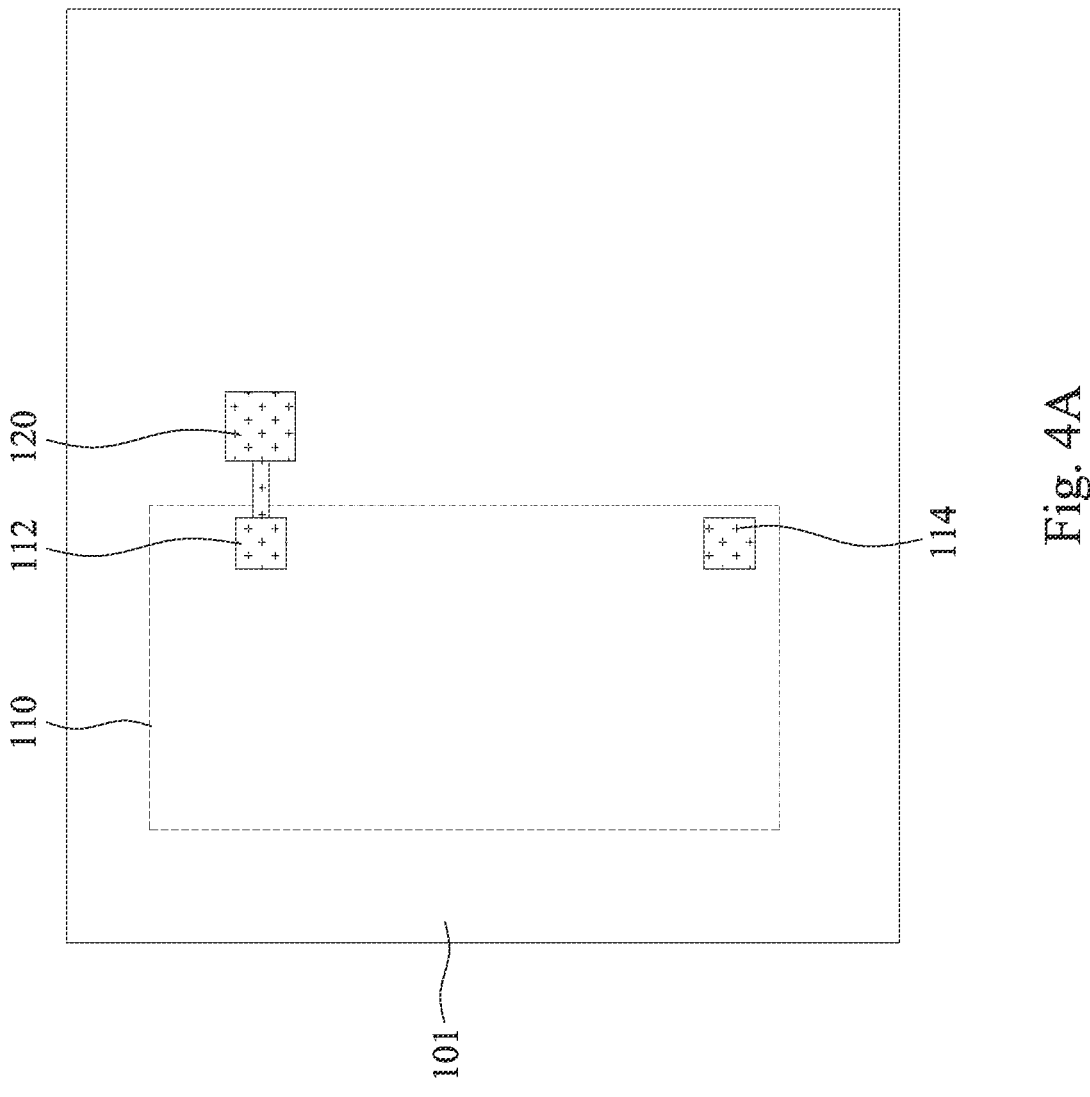
FIG. 4A to FIG. 4C illustrate top views at various stages of a manufacturing method of a package structure according to one embodiment of the present disclosure.
Figure 4B:
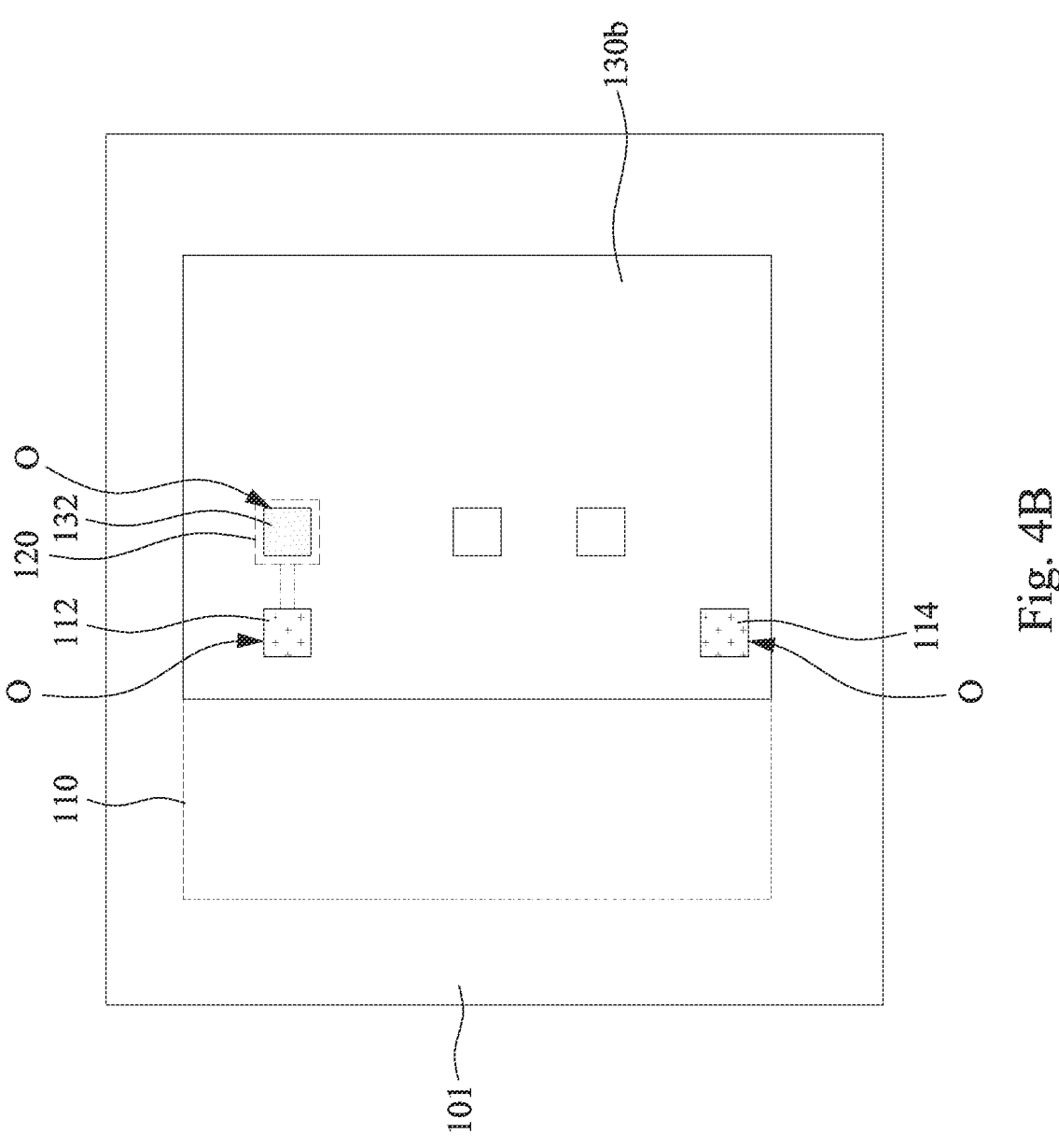
Figure 4C:
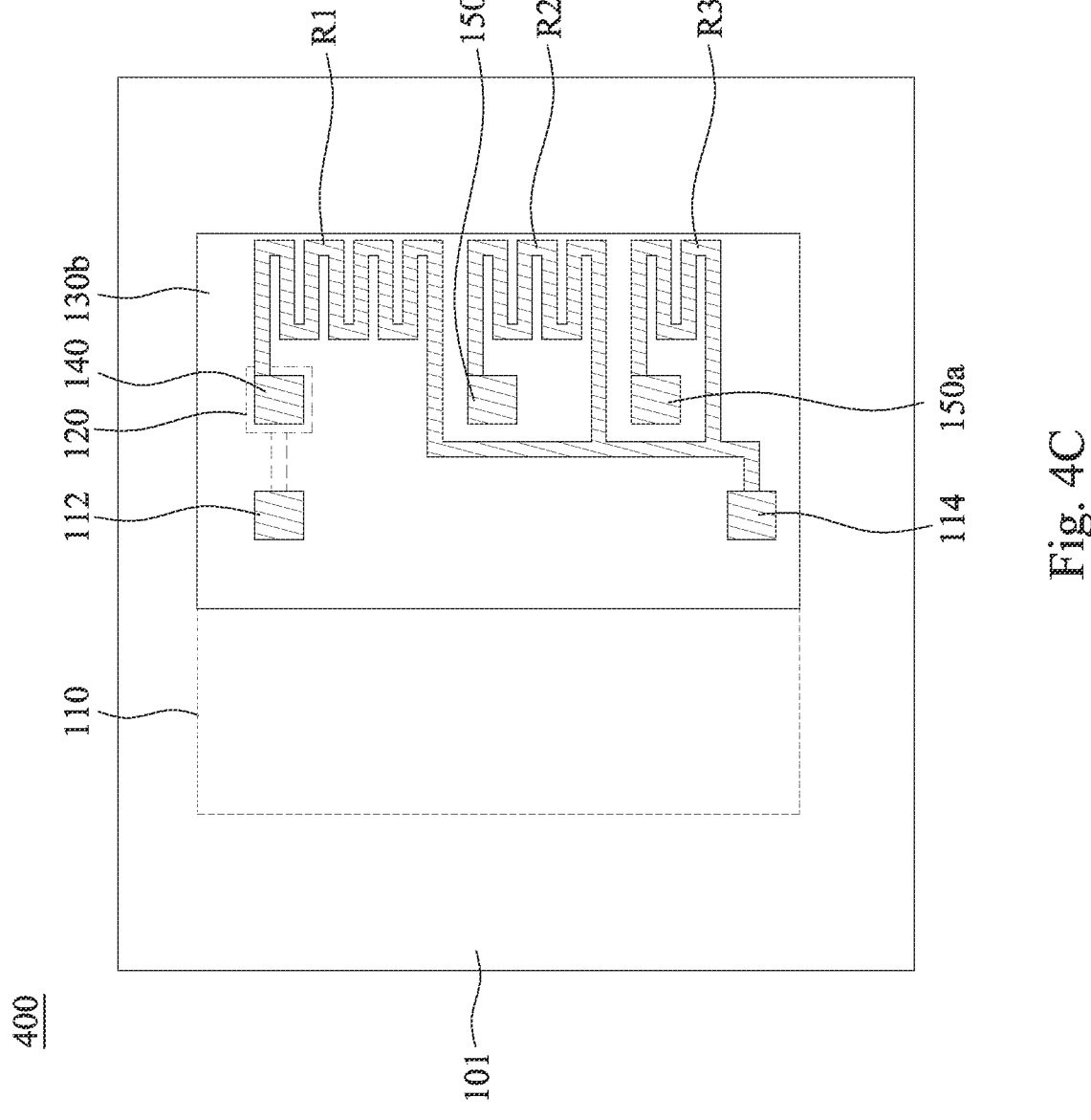

FIG. 4A to FIG. 4C illustrate top views at various stages of a manufacturing method of a package structure according to one embodiment of the present disclosure. Referring to FIG. 4A to FIG. 4C, first, the redistribution structure 110 and the first conductive portion 120 may be formed on the glass carrier 101. The first conductive portion 120 may be customized, and different numbers and sizes of the first conductive portion 120 may be provided according to requirements. The first conductive pad 112 and the second conductive pad 114 of the redistribution structure 110 are located at the same layer as the first conductive portion 120.

Next, a dielectric layer 130b may be formed on the redistribution structure 110 and the first conductive portion 120, and the dielectric layer 130b may be patterned so that the dielectric layer 130b has the three openings O. After the openings O are formed, conductive pillar 132 may be formed in the openings O on the first conductive portion 120. After the conductive pillar 132 is formed, the second conductive portion 140 and the third conductive portions 150 and 150a may be formed on the dielectric layer 130b. The dielectric layer 130b is located between the first conductive portion 120 and the second conductive portion 140, and the conductive pillar 132 in the dielectric layer 130b is electrically connected to the first conductive portion 120 and the second conductive portion 140. The second conductive portion 140 and the third conductive portions 150 and 150a may be the common level and may be manufactured according to a mask module.

In this embodiment, a package structure 400 further includes a first resistance line R1, a second resistance line R2 and a third resistance line R3. The first resistance line R1 is electrically connected between the second conductive portion 140 and the second conductive pad 114. The second resistance line R2 is electrically connected between the third conductive portion 150 and the second conductive pad 114. The third resistance line R3 is electrically connected between the third conductive portion 150a and the second conductive pad 114. The second resistance line R2, the third resistance line R3 and the third conductive portions 150 and 150a are located at the same layer. In addition, the second resistance line R2 and the third resistance line R3 do not overlap any conductive portion located at the same layer as the first conductive portion 120, and a length of the first resistance line R1 and a length of the second resistance line R2 are different. In detail, the length of the first resistance line R1 is greater than the length of the second resistance line R2, and the length of the second resistance line R2 is greater than the length of the third resistance line R3. Integrated passive devices may be manufactured together with the redistribution structure 110 to reduce the manufacturing cost of the integrated passive devices. In addition, the difficulty of manufacturing the integrated passive devices may be reduced, and the number of the integrated passive devices may be increased to improve the performance of the overall device.

Figure 4D:
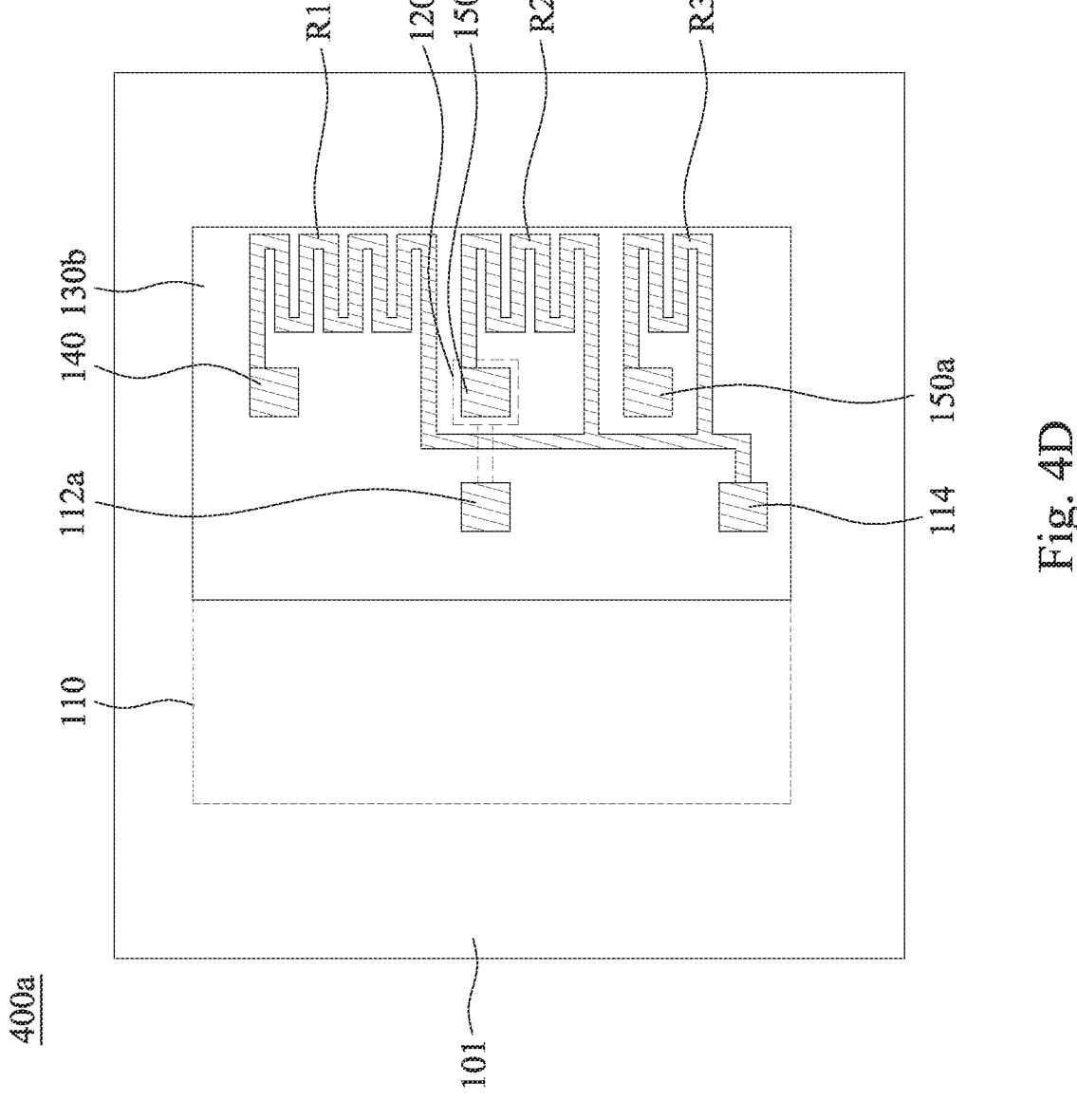
FIG. 4D illustrates a top view of a package structure according to another embodiment of the present disclosure.

FIG. 4D illustrates a top view of a package structure 400a according to another embodiment of the present disclosure. Referring to FIG. 4D, the difference between this embodiment and the embodiment in FIG. 4C is a first conductive pad 112a of the package structure 400a is electrically connected to a first conductive portion 120a, and the first conductive portion 120a is electrically connected to the third conductive portion 150. In this embodiment, positions of the first conductive pad 112a and the first conductive portion 120a may be designed according to requirements.

Figure 4E:
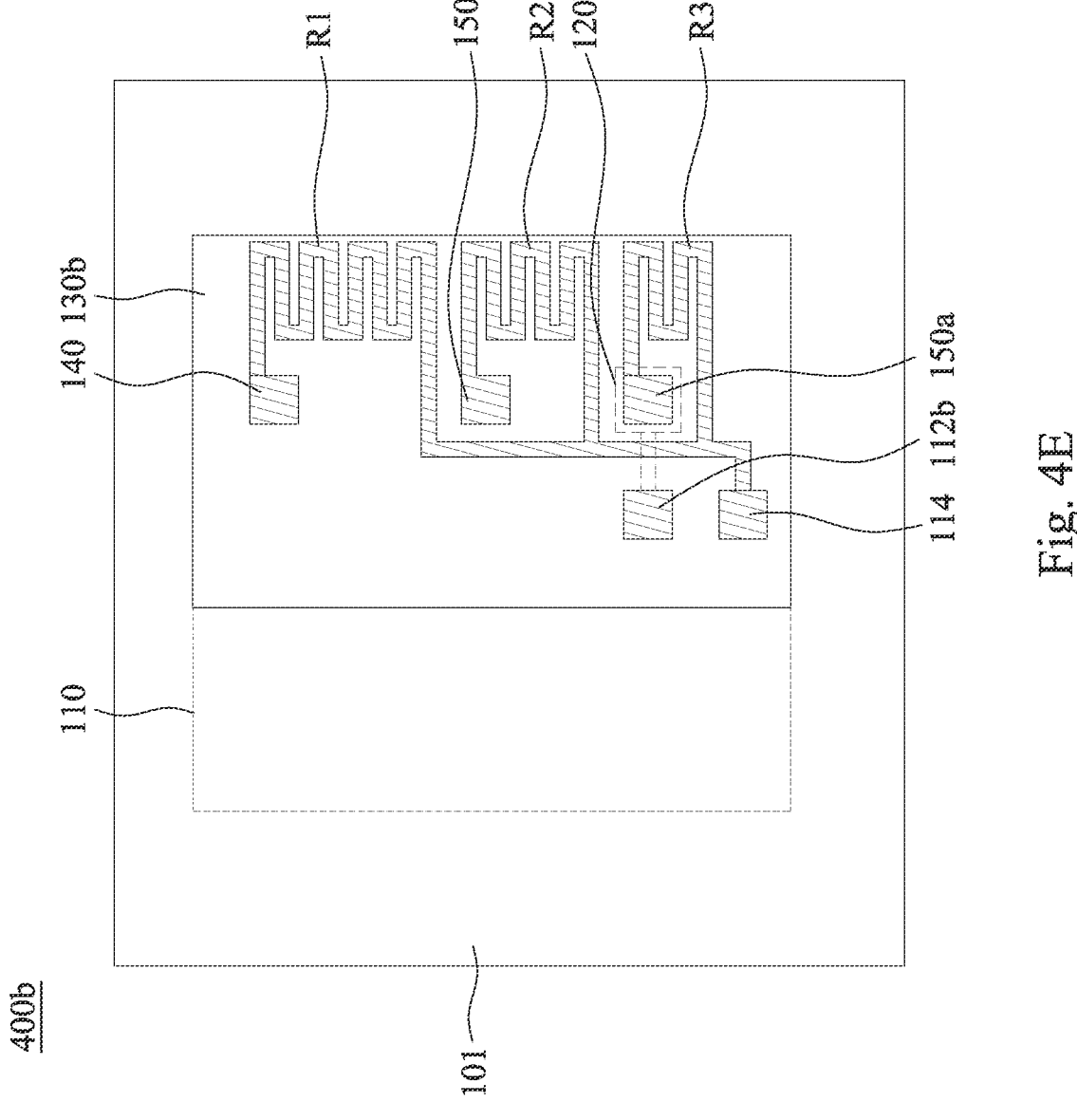
FIG. 4E illustrates a top view of a package structure according to another embodiment of the present disclosure.

FIG. 4E illustrates a top view of a package structure according to another embodiment of the present disclosure. Referring to FIG. 4E, the difference between this embodiment and the embodiment in FIG. 4D is a first conductive pad 112b of the package structure 400b is electrically connected to a first conductive portion 120b, and the first conductive portion 120b is electrically connected to the third conductive portion 150a. In this embodiment, positions of the first conductive pad 112b and the first conductive portion 120b may be designed according to requirements.

Figure 5A:
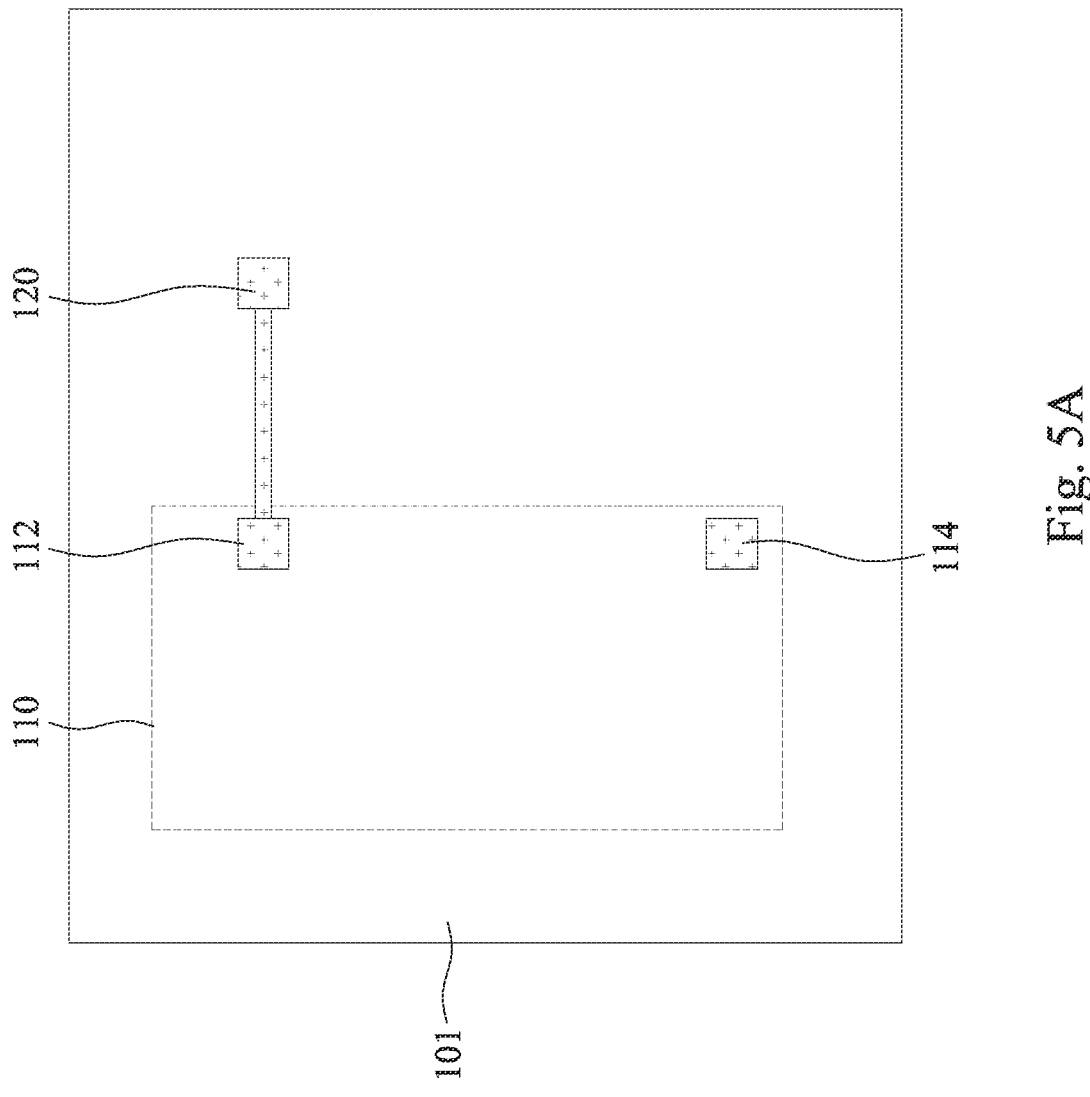
FIG. 5A to FIG. 5C illustrate top views at various stages of a manufacturing method of a package structure according to one embodiment of the present disclosure.
Figure 5B:
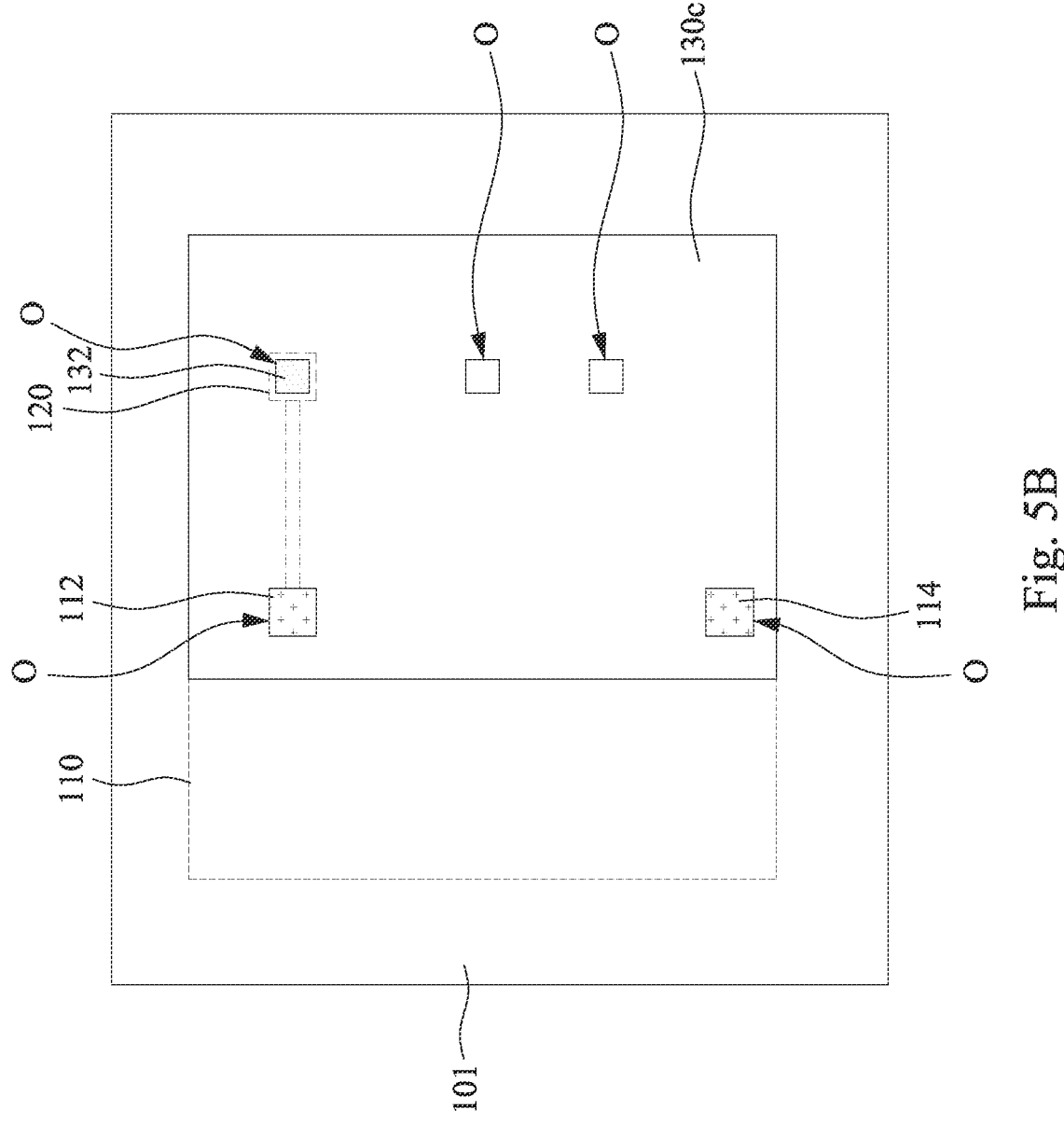
Figure 5C:
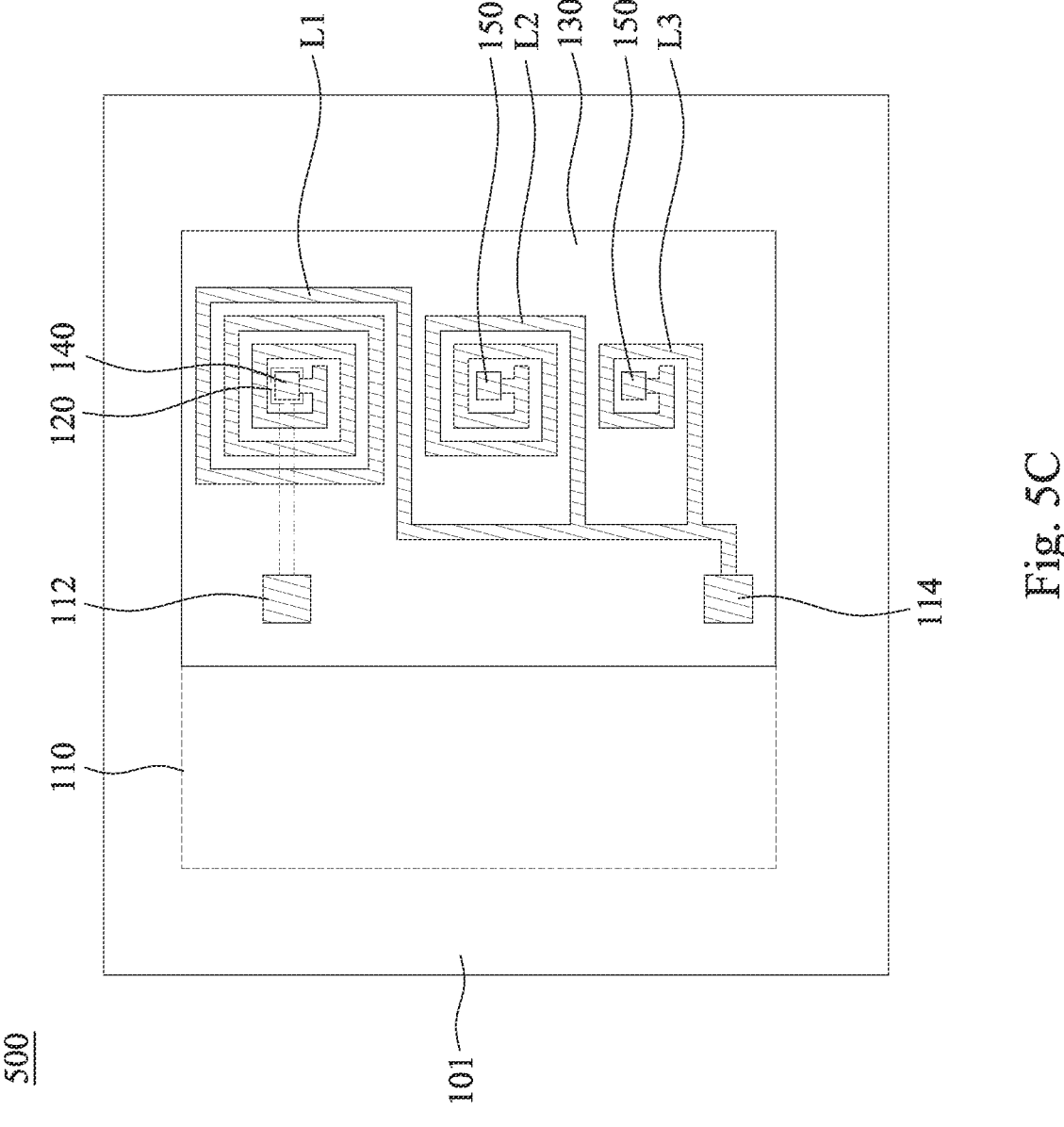

FIG. 5A to FIG. 5C illustrate top views at various stages of a manufacturing method of a package structure according to one embodiment of the present disclosure. Referring to FIG. 5A to FIG. 5C, first, the redistribution structure 110 and the first conductive portion 120 may be formed on the glass carrier 101. The first conductive portion 120 may be customized, and different numbers and sizes of the first conductive portion 120 may be provided according to requirements. The first conductive pad 112 and the second conductive pad 114 of the redistribution structure 110 are located at the same layer as the first conductive portion 120.

Next, a dielectric layer 130c may be formed on the redistribution structure 110 and the first conductive portion 120, and the dielectric layer 130c may be patterned such that the dielectric layer 130c has the five openings O. After the openings O are formed, the conductive pillars 132 may be formed in the openings O on the first conductive portion 120. After the conductive pillars 132 are formed, the second conductive portion 140 and the third conductive portions 150 and 150a may be formed on the dielectric layer 130c. The dielectric layer 130c is located between the first conductive portion 120 and the second conductive portion 140, and the conductive pillars 132 in the dielectric layer 130c are electrically connected to the first conductive portion 120 and the second conductive portion 140. The second conductive portion 140 and the third conductive portions 150 and 150a may be the common level and may be manufactured according to a mask module.

Referring to FIG. 5C, in this embodiment, a package structure 500 further includes a first inductive coil L1, a second inductive coil L2 and a third inductive coil L3. The first inductive coil L1 is electrically connected between the second conductive portion 140 and the second conductive pad 114. The second inductive coil L2 is electrically connected between the third conductive portion 150 and the second conductive pad 114. The third inductive coil L3 is electrically connected between the third conductive portion 150a and the second conductive pad 114. The second inductive coil L2 and the third conductive portion 150 are located at the same layer. The second inductive coil L2 does not overlap any conductive portion located at the same layer as the first conductive portion 120. The number of turns of the first inductive coil L1 is different from the number of turns of the second inductive coil L2. In detail, the number of turns of the first inductive coil L1 is greater than the number of turns of the second inductive coil L2, and the number of turns of the second inductive coil L2 is greater than the number of turns of the third inductive coil L3. The integrated passive devices may be fabricated together with the redistribution structure 110 to reduce the manufacturing cost of the integrated passive devices. In addition, the difficulty of manufacturing the integrated passive devices may be reduced, and the number of the integrated passive devices may be increased to improve the performance of the overall device.

Figure 5D:
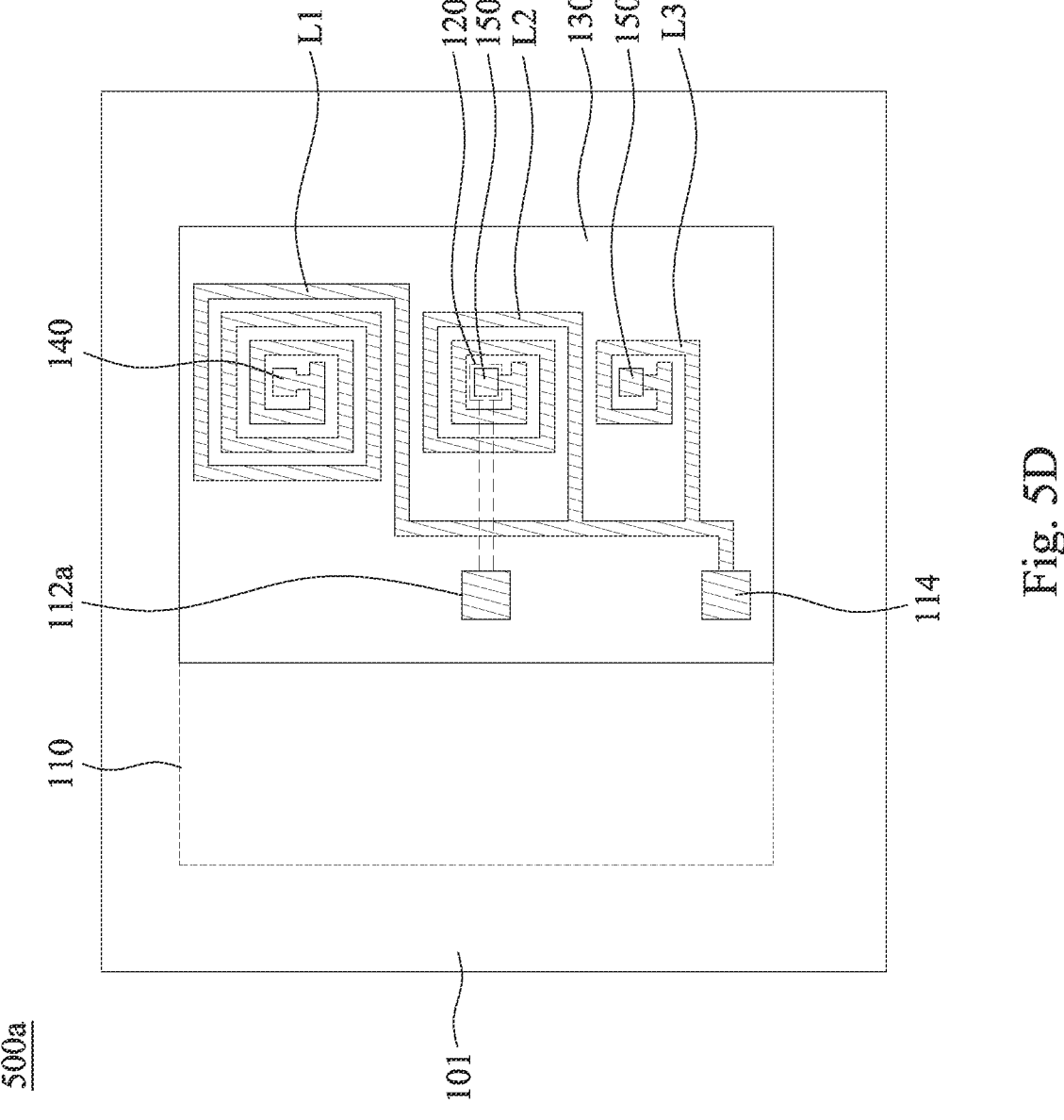
FIG. 5D illustrates a top view of a package structure according to another embodiment of the present disclosure.

FIG. 5D illustrates a top view of a package structure according to another embodiment of the present disclosure. Referring to FIG. 5D, the difference between this embodiment and the embodiment in FIG. 5C is the first conductive pad 112a of a package structure 500a is electrically connected to the first conductive portion 120a. The first conductive portion 120a is electrically connected to the third conductive portion 150. The second inductive coil L2 is electrically connected to the third conductive portion 150. In this embodiment, positions of the first conductive pad 112a and the first conductive portion 120a may be designed according to requirements.

Figure 5E:
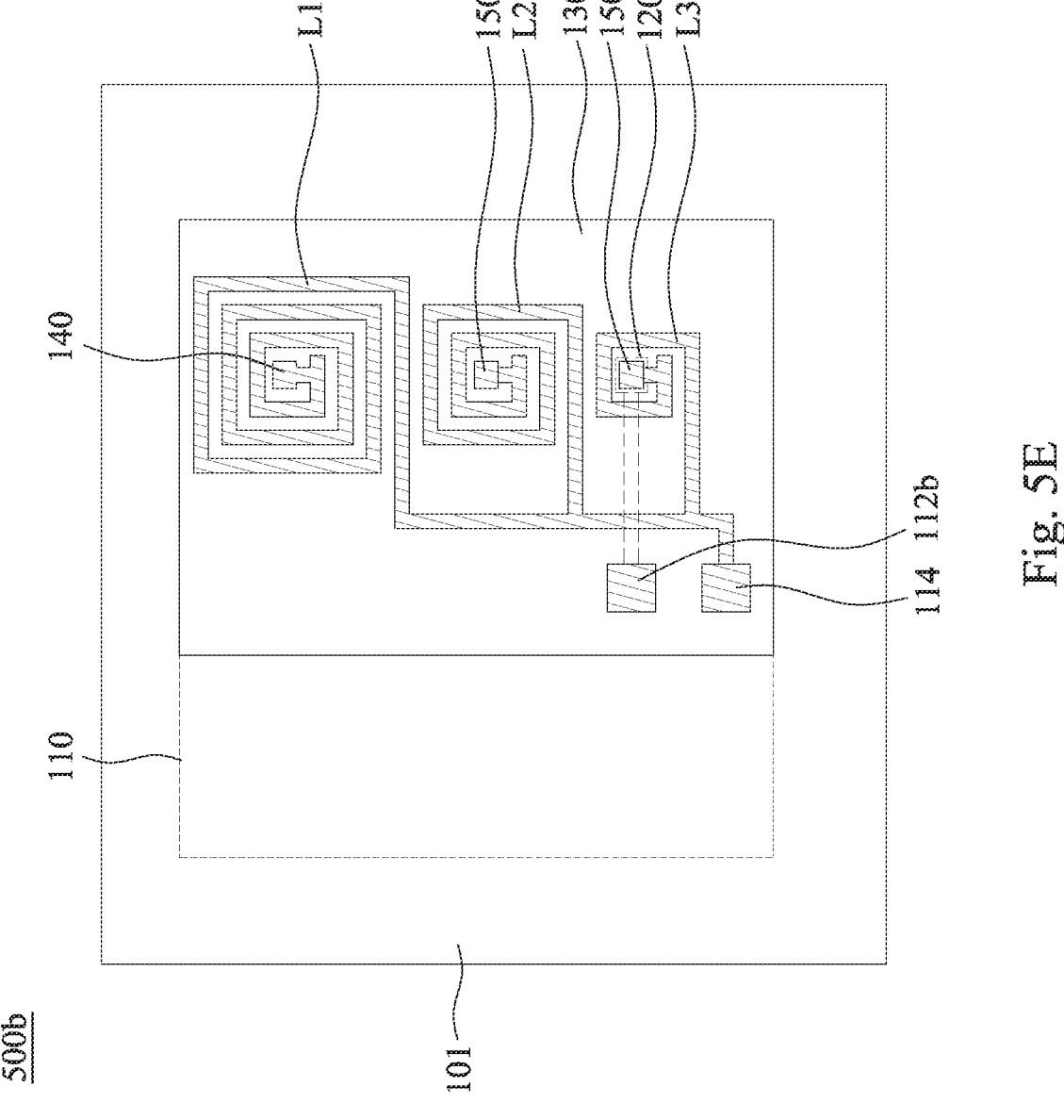
FIG. 5E illustrates a top view of a package structure according to another embodiment of the present disclosure.

FIG. 5E illustrates a top view of a package structure according to another embodiment of the present disclosure. Referring to FIG. 5E, the difference between this embodiment and the embodiment in FIG. 5D is the first conductive pad 112b of a package structure 500b is electrically connected to the first conductive portion 120b. The first conductive portion 120b is electrically connected to the third conductive portion 150a. The third inductive coil L3 is electrically connected to the third conductive portion 150a. In this embodiment, positions of the first conductive pad 112b and the first conductive portion 120b may be designed according to requirements.

FIG. 6 illustrates a flow chart of a manufacturing method of a package structure according to one embodiment of the present disclosure. The manufacturing method of the package structure includes steps as outlined below. In step S1, a redistribution structure including a first conductive pad and a second conductive pad and a first conductive portion are formed on a glass carrier, wherein the first conductive portion is electrically connected to the first conductive pad. In step S2, a second conductive portion electrically connected to the second conductive pad and a third conductive portion located at the same layer as the second conductive portion are formed, wherein the first conductive portion at least partially overlaps the second conductive portion, and the third conductive portion does not overlap any conductive portion located at the same layer as the first conductive portion. In the following description, the aforementioned steps will be described in detail.

Referring to FIG. 1B, the redistribution structure 110 and the first conductive portion 120 including the first conductive pad 112 and the second conductive pad 114 may be formed on the glass carrier 101. The first conductive portion 120 is electrically connected to the first conductive pad 112 of the redistribution structure 110. In some embodiments, the redistribution structure 110 and the first conductive portion 120 are formed on the glass carrier 101 so that the first conductive portion 120 and the first conductive pad 112 and the second conductive pad 114 of the redistribution structure 110 are located at the same layer. In addition, the redistribution structure 110 is formed on the glass carrier 101 so that the first conductive pad 112 is separated from the second conductive pad 114.

Referring to FIG. 10, the manufacturing method further includes forming the dielectric layer 130 on the redistribution structure 110 and the first conductive portion 120 before forming the second conductive portion 140 and the third conductive portions 150 and 150*a* (see FIG. 1A) so that the first conductive portion 120, the dielectric layer 130 and the second conductive portion 140 form a capacitor.

Referring to FIG. 1A, the second conductive portion 140 electrically connected to the second conductive pad 114 and the third conductive portions 150 and 150*a* located at the same layer as the second conductive portion 140 may be formed. The first conductive portion 120 at least partially overlaps the second conductive portion 140. The third conductive portions 150 and 150*a* do not overlap any conductive portion located at the same layer as the first conductive portion 120.

In addition, referring to FIG. 4B, the manufacturing method further includes: forming the dielectric layer 130*b* on the redistribution structure 110 and the first conductive portion 120 before forming the second conductive portion 140 and the third conductive portions 150 and 150*a* (see FIG. 4C); and forming the conductive pillar 132 in the dielectric layer 130*b* so that the conductive pillar 132 is electrically connected to the first conductive portion 120 and the second conductive portion 140.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a first circuit;
a second circuit located above the first circuit;
a redistribution structure located above the first circuit and comprising a first conductive pad and a second conductive pad;
a dielectric layer located above the redistribution structure, wherein the dielectric layer is made of a material including silicon nitride or titanium oxide;
a first conductive portion electrically connected to the first conductive pad;
a second conductive portion electrically connected to the second conductive pad, wherein the first conductive portion at least partially overlaps the second conductive portion;
a third conductive portion located at the same layer as the second conductive portion, wherein the second conductive portion and the third conductive portion are located above the dielectric layer, wherein the third conductive portion does not overlap any conductive portion located at the same layer as the first conductive portion;

a chip disposed on the second circuit and electrically connected with the redistribution structure; and
a first patterned material layer, wherein the first circuit is located above the first patterned material layer, wherein the first circuit does not overlap the first conductive pad and the second conductive pad, and wherein the first circuit overlaps the second circuit.

2. The package structure of claim 1, wherein the dielectric layer is located between the first conductive portion and the second conductive portion, wherein the first conductive portion, the dielectric layer and the second conductive portion form a capacitor.

3. The package structure of claim 2, wherein an area of a surface of the second conductive portion facing the dielectric layer is different from an area of a surface of the third conductive portion facing the dielectric layer.

4. The package structure of claim 1, further comprising:
a conductive pillar located in the dielectric layer and electrically connected to the first conductive portion and the second conductive portion, wherein the dielectric layer is located between the first conductive portion and the second conductive portion.

5. The package structure of claim 4, further comprising:
a first resistance line electrically connected between the second conductive portion and the second conductive pad.

6. The package structure of claim 5, further comprising:
a second resistance line electrically connected to the third conductive portion, wherein the second resistance line is located at the same layer as the third conductive portion, and the second resistance line does not overlap any conductive portion located at the same layer as the first conductive portion.

7. The package structure of claim 6, wherein a length of the first resistance line is different from a length of the second resistance line.

8. The package structure of claim 4, further comprising:
a first inductive coil electrically connected between the second conductive portion and the second conductive pad.

9. The package structure of claim 8, further comprising:
a second inductive coil electrically connected to the third conductive portion, wherein the second inductive coil is located at the same layer as the third conductive portion, and the second inductive coil does not overlap any conductive portion located at the same layer as the first conductive portion.

10. The package structure of claim 9, wherein the number of turns of the first inductive coil is different from the number of turns of the second inductive coil.

11. The package structure of claim 1, further comprising a second patterned material layer, a third patterned material layer, a fourth patterned material layer and a fifth patterned material layer, wherein the second patterned material layer, the third patterned material layer, and the fourth patterned material layer are located between the dielectric layer and the first patterned material layer.

12. The package structure of claim 11, wherein the first conductive pad, the second conductive pad, and at least a portion of the second circuit are located in the fifth patterned material layer.

13. The package structure of claim 1, wherein the redistribution structure is located between the dielectric layer and the first circuit, wherein the dielectric layer does not overlap the second circuit.

14. A manufacturing method of a package structure, comprising:

forming a first circuit and a first patterned material layer on a glass carrier, wherein the first circuit is located above the first patterned material layer;

forming a second circuit located above the first circuit;

forming a redistribution structure located above the first circuit and comprising a first conductive pad and a second conductive pad;

forming a first conductive portion on the glass carrier:

wherein the first conductive portion is electrically connected to the first conductive pad, wherein the first circuit does not overlap the first conductive pad and the second conductive pad, wherein the first circuit overlaps the second circuit;

forming a dielectric layer located above the redistribution structure, wherein the dielectric layer is made of a material including silicon nitride or titanium oxide;

forming a second conductive portion electrically connected to the second conductive pad and a third conductive portion located at the same layer as the second conductive portion, wherein the first conductive portion at least partially overlaps the second conductive portion, and the third conductive portion does not overlap any conductive portion located at the same layer as the first conductive portion, wherein the second conductive portion and the third conductive portion are located above the dielectric layer; and disposing a chip on the second circuit, wherein the chip is electrically connected with the redistribution structure.

15. The method of claim 14, wherein forming the redistribution structure and the first conductive portion on the glass carrier is performed such that the first conductive portion, the first conductive pad and the second conductive pad are located at the same layer.

16. The method of claim 14, wherein forming the redistribution structure on the glass carrier is performed such that the first conductive pad is separated from the second conductive pad.

17. The method of claim 14, wherein forming the dielectric layer on the redistribution structure and the first conductive portion prior to forming the second conductive portion and the third conductive portion such that the first conductive portion, the dielectric layer and the second conductive portion form a capacitor.

18. The method of claim 14, further comprising:

forming a conductive pillar in the dielectric layer such that the conductive pillar is electrically connected to the first conductive portion and the second conductive portion.

* * * * *